United States Patent [19]
Os

[11] Patent Number: 5,637,177
[45] Date of Patent: Jun. 10, 1997

[54] LAMINATING APPARATUS HAVING A RECIPROCATING PRESS ROLLER

[75] Inventor: Arlen Van Os, Grandville, Mich.

[73] Assignee: Van Os Enterprises, Jenison, Mich.

[21] Appl. No.: 350,970

[22] Filed: Dec. 7, 1994

[51] Int. Cl.$^6$ .................................................. B29C 65/00
[52] U.S. Cl. .......................... 156/286; 156/580; 156/582; 100/156; 100/210
[58] Field of Search ........................ 156/580, 582, 156/583.1, 286; 100/93 RP, 156, 210

[56] References Cited

U.S. PATENT DOCUMENTS

| | | | |
|---|---|---|---|
| 3,671,363 | 6/1972 | Aruder | 156/556 |
| 3,994,489 | 11/1976 | Henc | 271/132 |
| 4,040,888 | 8/1977 | Soska et al. | 156/497 |
| 4,506,442 | 3/1985 | Alzmann et al. | 29/830 |
| 4,535,209 | 8/1985 | Kurz | 200/83 R |
| 4,875,966 | 10/1989 | Perko | 156/580 |
| 4,991,285 | 2/1991 | Shaheen et al. | 29/830 |
| 5,039,371 | 8/1991 | Cremens et al. | 156/382 |
| 5,048,178 | 9/1991 | Bindra et al. | 29/830 |
| 5,105,532 | 4/1992 | Fritsch | 29/740 |
| 5,106,450 | 4/1992 | Freisitzer et al. | 156/517 |
| 5,114,302 | 5/1992 | Meisser et al. | 414/751 |
| 5,176,785 | 1/1993 | Poyet et al. | 156/574 |
| 5,211,108 | 5/1993 | Gore et al. | 100/48 |
| 5,218,753 | 6/1993 | Suzuki et al. | 29/740 |
| 5,230,765 | 7/1993 | Weiselfish et al. | 156/350 |
| 5,233,745 | 8/1993 | Morita | 29/705 |
| 5,249,359 | 10/1993 | Schubert et al. | 29/890.039 |
| 5,271,150 | 12/1993 | Inasaka | 29/852 |

FOREIGN PATENT DOCUMENTS 104641  1/1985  Japan.

*Primary Examiner*—James Sells
*Attorney, Agent, or Firm*—Young & Basile P.C.

[57] ABSTRACT

An apparatus for laminating a plurality of components to one another in an assembly includes a table having an upper surface for successively stacking a plurality of components in registered, aligned, superimposed relation to one another to enable the components to be joined to one another. The upper surface of the table has a plurality of apertures formed therein. A source of vacuum is selectively connectible to the plurality of apertures formed in the upper surface of the table for holding at least one component in place when positioned thereon for lamination, two spaced apart, parallel, linear guide rails are connected to the table. An elongated roller has opposite ends connected to the rails for sliding, guided movement along the rails as the roller rollingly engages the upper surface of the table. A drive mechanisms is connected to the roller for reciprocating the roller along a path defined by the rails. At least one sensor is movable with respect to the table for selectively positioning an end limit of travel of the roller along the path. An adjustable mechanism is connected to the roller for selectively varying pressure applied by the roller with respect to the table during lamination. A roller guard surrounds a substantial portion of a circumference of the roller for preventing the roller from engaging an object having a thickness greater than approximately 3/16 of an inch during lamination.

21 Claims, 5 Drawing Sheets

LAMINATING APPARATUS HAVING A RECIPROCATING PRESS ROLLER

FIELD OF THE INVENTION

The present invention relates to a sheet laminating apparatus for membrane assembly, and in particular electronic circuit membrane assembly for touch sensitive pads of electronic equipment, where two successively stacked components are urged together gradually by a press roller with sufficient force to expel air between the two components just before adhesion to one another.

BACKGROUND OF THE INVENTION

Membrane assembly of touch sensitive pads for electronic equipment has typically been performed in a labor intensive manner by positioning a first component on a hard surface, removing a protective liner covering the adhesive on the top surface of the first component and positioning a second component on top of the first component and then manually applying pressure with a roller in an attempt to roll out all of the air bubbles that have been trapped between the first and second components that have been layered on one another. The manual placement also produces an undesirable amount of variation between the position of the second component superimposed with respect to the first component. Defects due to improper placement and the inclusion of unremovable air bubbles or other debris trapped in between the two layers causes a high rate of defective parts, which must be scraped, greatly increasing the overall cost of the acceptable completed assemblies.

Typically, a touch sensitive pad includes at least three layers which are laminated to one another. The first layer generally includes a substrate which may be rigid or flexible in nature supporting exposed electrically conductive areas separated from one another by non-conductive material areas that are partially or totally subsequently covered with an appropriate adhesive for laminating the second layer to the first layer. The second layer typically includes a resiliently flexible non-conductive material having open areas alignable with the conductive material areas of the first layer, and a suitable adhesive for receiving the third layer. The third layer is laminated in assembly with the previously laminated first and second layers against the adhesive of the second layer and typically is formed of a flexible sheet material having a conductive material at least in areas facing the conductive material of the first layer but separated by a fluid chamber formed by the open areas through the second layer. In operation, the operator's pressure on the third component surface pushes the electrically conductive surface of the third component layer into contact with the electrically conductive surface of the first component layer to complete a circuit between the first component layer and the third component layer, or to complete an electrical circuit between two separated electrically conductive portions formed in the first component layer by the bridging contact of the electrically conductive material in the third component layer.

A sheet laminating machine for feeding laminated sets to a press roller is disclosed in U.S. Pat. No. 3,671,363. Alignment between components of the multiple sheets to be laminated is accomplished by a stop engaging the leading edges of the sheets to be laminated as the sheets are fed toward a pressure roller. The stop is moved by the sheets in response to the feeding movement of the sheets themselves toward the roller. The stop is moved downwardly by the roller to a point below the plane of the sheets virtually simultaneously with the commencement of the pressure applying operation by the pressure roller onto the sheets. As soon as the stop passes beyond the trailing edges of the sheets being laminated, the stop returns to its normal position and is ready for engagement by and guiding of the next following sets of sheets to be laminated.

A method and apparatus for stacking a plurality of laminate layers to form a composite board is disclosed in U.S. Pat. No. 4,506,442. The apparatus stacks a plurality of laminate layers in registered, superimposed relation to enable the layers to be joined to form a composite board. The apparatus includes a table having a surface on which a plurality of laminate layers can be successively stacked in aligned, superimposed relation on pins slidably received in respective apertures in the table. The pins rest on support members which are carried on a lower support table mounted beneath the surface of the table in which the laminate layers are stacked. The lower support table is raised relative to the stack of laminate layers after successive laminate layers have been placed on the pins so that a given projection of the pins from the laminate layers will be obtained.

An alignment-registration tool for fabricating multi-layer electronic packages is disclosed in U.S. Pat. No. 5,048,178. The first layer of the package is brought into proximity to an optical system which is adapted for imaging a surface of the layer. The optical system images features on the surface of the first layer and generates targets around selected ones of the features. The next layer of the circuit package is brought into proximity to the optical system. The next layer is moved, by translation and rotation, until selected features of the layer coincide with the target generated through the optical system. This next layer is then placed atop the previous layer. Finally, the layers are laminated to form the multi-layer micro electronic circuit package.

A method of fabricating multi-layer board is disclosed in U.S. Pat. No. 4,991,285. The multi-layer board is fabricated by plating up conductive posts on a non-conductive layer. The tops of the posts are planarized, resulting in sharp corners. The posts are aligned with a template which has an aperture above each post and a second non-conductive layer is placed between the top of the post and the bottom of the template. The two layers are laminated together by compressing the second layer between the first layer and the template, and the posts punch through the second layer. Conductive traces may then be etched or deposited between the post tops and the process may be repeated as many times as desired.

None of the devices previously known provides an apparatus for sheet-to-sheet lamination of membrane assemblies in a manner to eliminate or greatly reduce the inclusion of undesirable air entrapment, wrinkles or bubbles.

SUMMARY OF THE INVENTION

It is therefore desirable in the present invention to provide a laminating apparatus capable of increasing productivity and quality, while decreasing the amount of scrap produced. It is further desirable in the present invention to automate the lamination of membranes to one another, while providing a flexible function or method of operation which is easily adjustable by the operator. Further, it is desirable in the present invention to provide a laminating apparatus which is capable of securely anchoring the lowermost component layer. In addition, it is desirable to provide the ability to align successively stacked components or membrane layers with respect to one another. It is a desirable characteristic to allow the operator's hands to be free in order to manipulate the uppermost membrane being laminated so that it comes into contact progressively with the lower component or assembly as it is pressed together by engagement with the laminating press roller. It is also desirable to permit the operator to flexibly adjust the operation of the laminating apparatus, including independent controls for the speed of the press roller in either direction, the length of the press roller stroke and the laminating direction of the press roller, either toward or away from the operator. It is also a desirable characteristic of the present invention to provide built in safety features that prevent the injury of the operator or damage to the equipment by the press roller engaging an object having a thickness greater than 3/16 of an inch.

The present invention provides an apparatus for laminating a plurality of components to one another in an assembly. The apparatus includes a table having a first surface for successively stacking a plurality of components in registered, aligned, superimposed relation to one another to enable the components to be joined to one another. The laminating apparatus also includes a roller mounted on the table and engageable with the stacked components for laminating the successively stacked components to one another by bringing the last two successively stacked components together gradually with sufficient force to expel fluid, such as air, between the two components just before adhesion to one another.

In operation, the present invention is a semi-automatic membrane assembly station, where an operator loads a first component onto a vacuum table over alignment pins. The operator removes a liner covering an adhesive layer formed on the first component, and then loads a second component onto the guide pins allowing only the area near the pins to come into contact with the first component. While the operator pushes a foot pedal, the press roller mechanism advances pressing the first and second components together until it reaches an adjustable stop, where the roller reverses and returns to the home position. The operator can then remove the completed component, or can continue to assemble additional layers, such as those used in touch sensitive pads for electronic equipment. A pressure sensitive, interlocked roller guard makes it impossible to roll over an object thicker than approximately 1/8 of an inch. The roller can apply an adjustable laminating force of up to 1000 pounds of force. The speed of the roller is also adjustable. A programmable logic controller can be reprogrammed without wiring changes.

The table of the laminating apparatus has an upper surface for successively stacking a plurality of components in registered, aligned, superimposed relation to one another to enable the components to be joined to one another. The upper surface also has a plurality of apertures formed therein. A source of vacuum is selectively connectible to the plurality of apertures formed in the upper surface of the table for holding at least one component in place when positioned thereon for lamination. Two spaced apart, parallel, linear guide rails are connected to the table. An elongated roller having opposite ends connected to the rails for sliding, guided movement along the rails, rollingly engages the upper surface of the table. Drive means is connected to the roller for reciprocating the roller along a path defined by the rails. At least one sensor is movable with respect to the table for selectively positioning an end limit of travel of the roller along the path. Adjustable means is connected to the roller for selectively varying pressure applied by the roller with respect to the table during the laminating process. A roller guard surrounds a substantial portion of a circumference of the roller for preventing the roller from engaging an object having a thickness greater than 3/16 of an inch during lamination.

Other objects, advantages and applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DESCRIPTION OF THE PREFERRED EMBODIMENT

Figure 1:
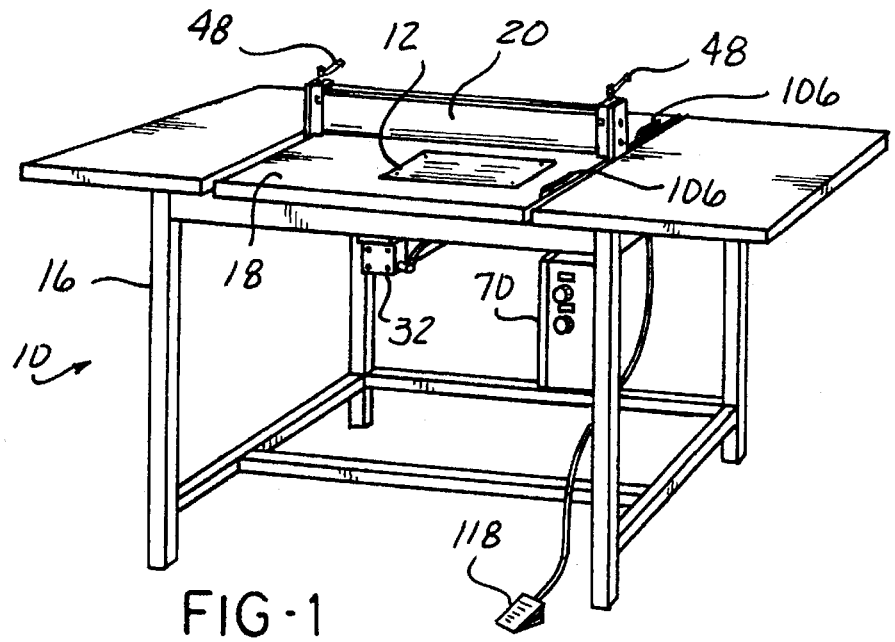
FIG. 1 is a perspective view of a laminating apparatus having a reciprocating press roller according to the present invention.
Figure 2:
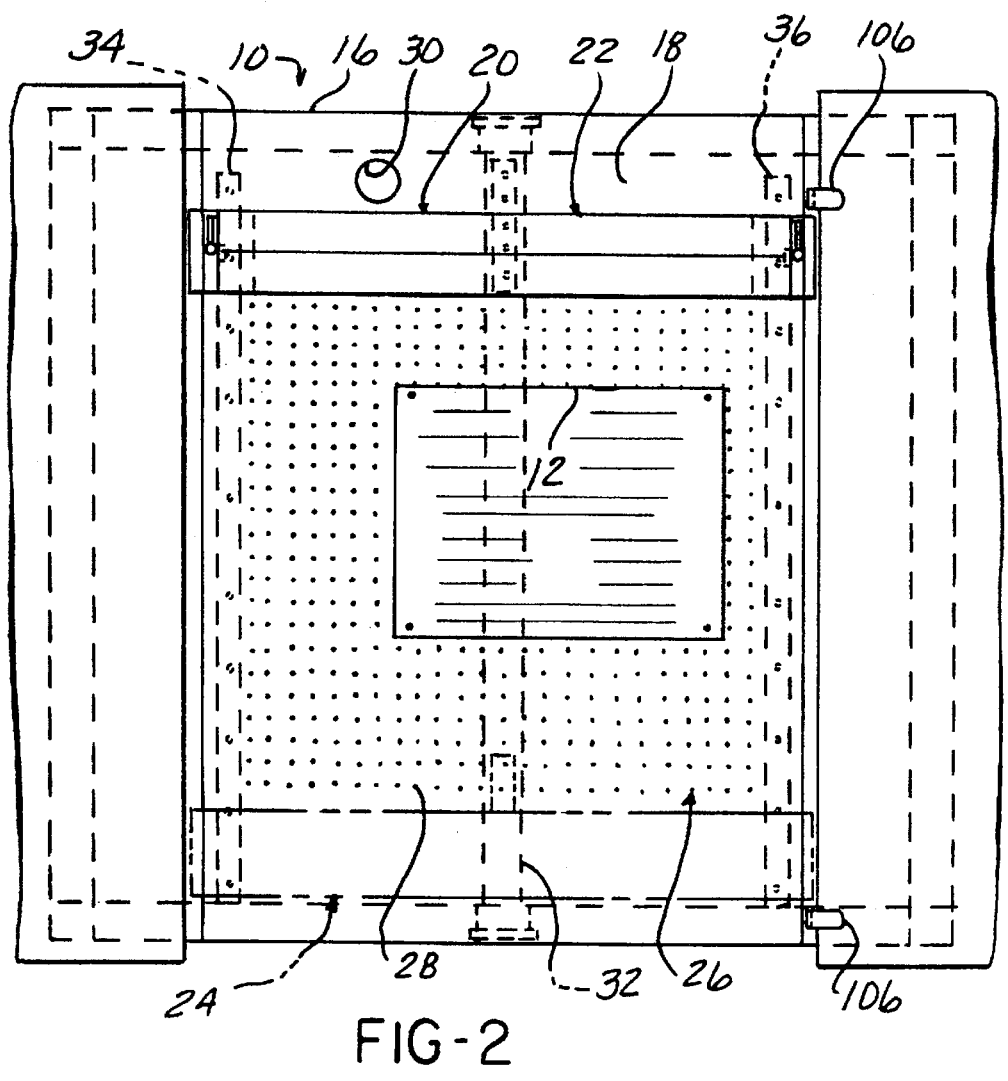
FIG. 2 is a plan view of the laminating apparatus according to the present invention.
Figure 5:
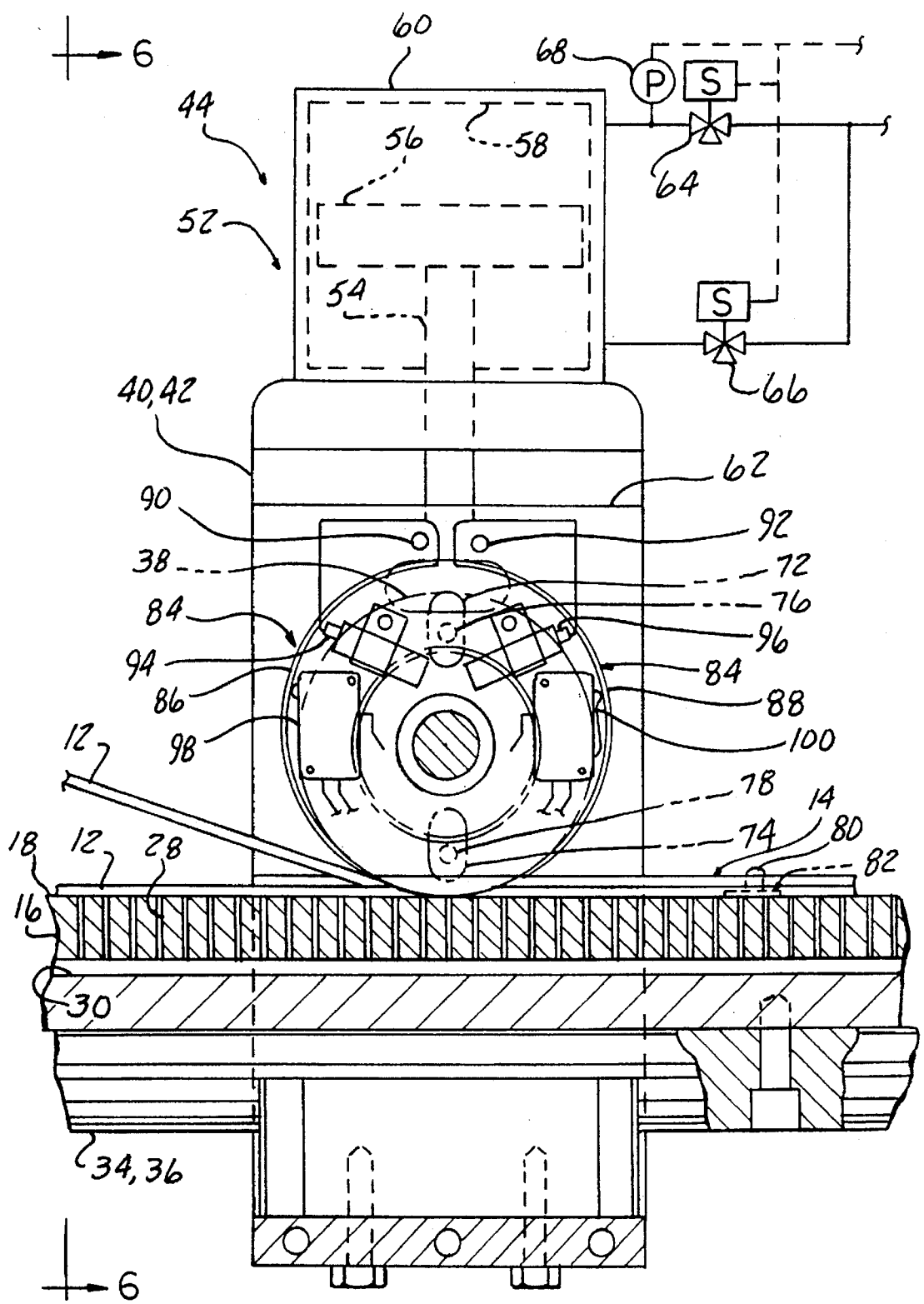
FIG. 5 is a detailed cross-sectional view of the reciprocating press roller mechanism according to the present invention.

An apparatus 10 for laminating a plurality of components 12 to one another in an assembly 14 is depicted generally in FIGS. 1–4. The apparatus 10 includes a table 16 having a first surface 18 for successively stacking a plurality of components 12 in registered, aligned, superimposed relation to one another to enable the components 12 to be joined to one another. Roller means 20 is mounted on the table 16 and is engageable with the stacked components 12. The roller means 20 laminates successively stacked components 12 to one another by bringing the last two successively stacked components 12 together gradually with sufficient force to expel fluid, such as air, between the two components 12 just before adhesion to one another. The roller means 20 reciprocally moves between the first and second end limits of travel 22 and 24 best seen in FIGS. 2 and 4, across the successively stacked components 12. As illustrated, the roller means 20 reciprocally moves along a linear path toward and away from the operator and rotates about an axis which is normal, or perpendicular to the linear path. Vacuum means 26 holds a lowermost component 12 of the successively stacked components 12 to the first surface 18 of the table 16, as best seen in FIGS. 1, 2 and 5. The vacuum means 26 may include a plurality of apertures 28 formed in the upper or first surface 18 of the table 16 and a passage 30 selectively connectible to a source of vacuum (not shown) in communication with the plurality of apertures 28 for holding at least one component 12 in place when positioned on the first surface 18 for lamination.

Figure 6:
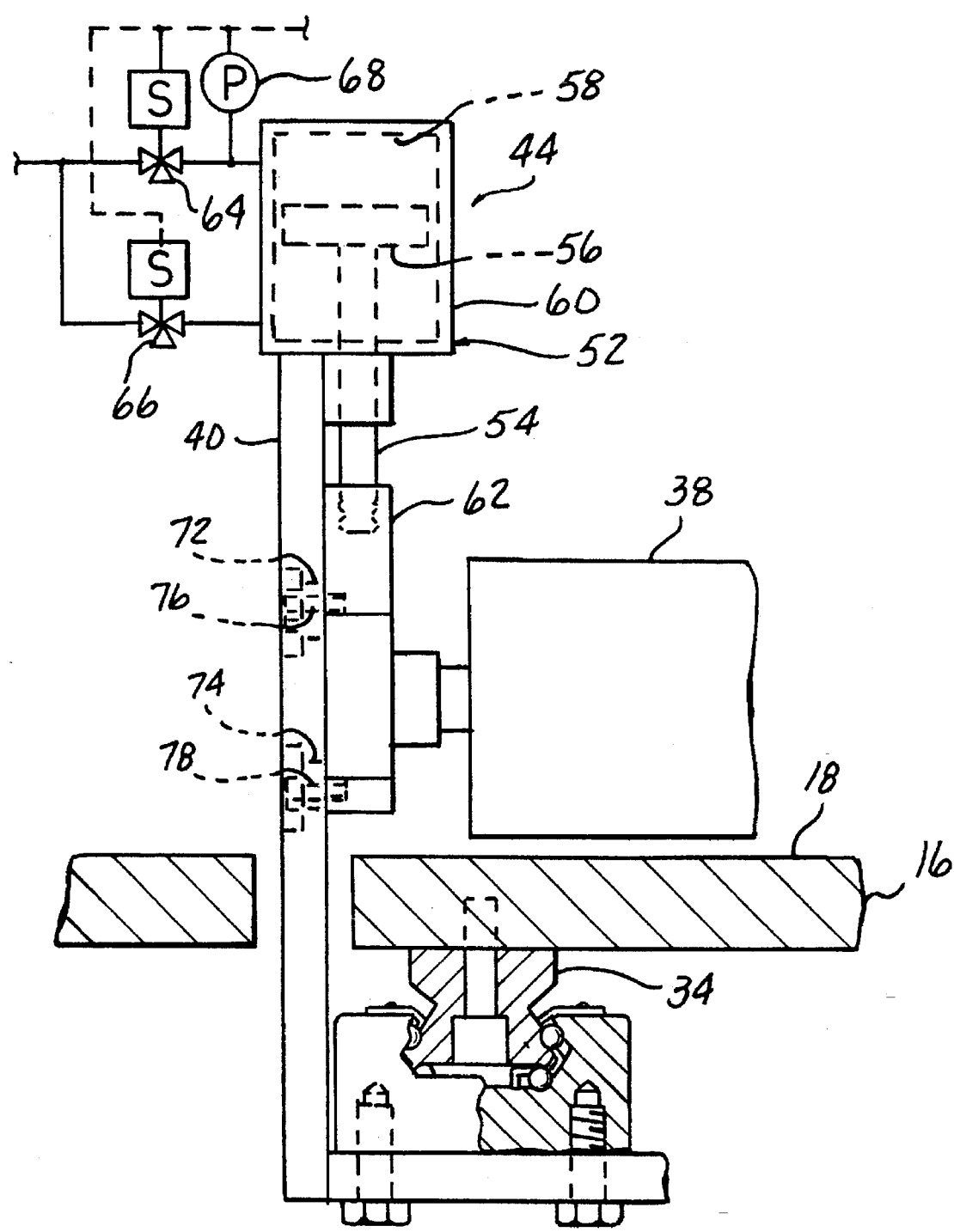
FIG. 6 is a cross-sectional detail of the reciprocating press roller mechanism taken as shown in FIG. 5.

Drive means 32 is connected to the roller means 20 for reciprocating the roller means 20 along a fixed path. The drive means 32 may be any suitable mechanism, such as a fluid operated reciprocating piston within a cylinder, a belt or chain drive mechanism, an electronically controllable, reversible, variable speed electric motor driving a rotatable screw and nut assembly, or in its preferred form, a rodless pneumatic cylinder. As seen in FIGS. 1 and 2, the drive means 32 can be positioned below the table 16. Two spaced apart, parallel linear guide rails 34 and 36 can also be positioned under the table 16 to define the fixed path of travel for the roller means 20. The roller means 20 may include an elongated roller 38 having opposite ends connected to the rails 34 and 36 respectively for sliding, guided movement along the rails 34 and 36 as the roller 38 rollingly engages the upper surface 18 of the table 16. The roller 38 may be formed of a hard material, such as metal, of a compressible material, such as rubber or plastic, or of a combination thereof. First and second support brackets 40 and 42 slidingly engage the two guide rails 34 and 36 respectively and extend upwardly through the table 16 to support the opposite ends of the elongated roller 38 as best seen in the detail of FIGS. 5 and 6.

Means 44 for adjusting the pressure applied by the roller means 20 with respect to the table 16 is attached to an upper end of each of the first and second support brackets 40 and 42. As illustrated in FIGS. 1–4, the pressure adjusting means 44 can include a threaded manually adjustable screw 46 having a handle 48 and/or a nut 50 for changing the pressure applied by the roller means 20 to the table 16. The handle 48 can be manually manipulated to increase or decrease the pressure of the roller 38 against the first surface 18 of the table 16, or if greater precision is required, a torque wrench may be connected to a drive nut 50 in order to accurately set the amount of pressure between the elongated roller 38 and the first surface 18 of the table 16.

The pressure adjusting means 44 can also include a fluid operated actuator 52. The fluid operated actuator 52 may include a rod 54 connected to a piston 56 at one end reciprocally positioned within a chamber 58 of a housing 60, and an opposite end of the rod 54 connected to a vertically movable bearing plate 62 attached to the opposite ends of the elongated roller 38. The fluid operated actuator 52 connected to the upper end of each of the first and second support brackets, 40 and 42 respectively, may be manually adjustable, or through appropriate control valves 64, 66 and pressure sensor 68 be connected to control means 70 (FIG. 1) for automatically varying the pressure applied by the elongated roller 38 to the first surface 18 of the table 16 as the elongated roller 38 passes over the successively stacked plurality of components 12. The bearing plate 62 is connected to the respective support bracket, 40 and 42, through a pair of elongated vertically extending slots, 72 and 74 with slidable bolts or pins 76 and 78 disposed therein, as best seen in FIGS. 5 and 6.

Pin means 80 is connectible to the table 16 for cooperatively engaging with each of the successively stacked components 12 to align and superimpose the successively stacked components 12 on top of one another. The pin means 80 may include an adhesively applied pin 82 connected to the first surface 18 of the table 16 in any desired position. A suitable pin 82 is commonly referred to as a "Carlson" stripper pin in the trade. A typical stripper pin 82 is 1 inch by ¾ inch and approximately 3/16 inch thick.

Means 84 for preventing engagement of the roller means 20 with an object greater than 3/16 of an inch thick is also provided as best seen in FIG. 5. The engagement preventing means 84 can include a pivotal guard, or pair of guards 86 and 88, covering a substantial portion of the roller means 20. Each guard, 86 and 88, is pivotally connected to the opposing bearing plates 62 (FIGS. 3 and 5) connected to opposite ends of the elongated roller 38 of the roller means 20 about pivot pins 90 and 92. Spring plungers 94 and 96 bias each respective guard 86 and 88 outwardly from the circumferential surface of the roller means 20. Each guard, 86 and 88, is then normally biased into a position spaced radially outwardly from the circumferential surface of the elongated roller 38 about a hinge or pivot axis defined by pivot pins 90 and 92 offset from the central rotational axis of the elongated roller 38. At least one sensor 98 engages each guard 86 and 88 to signal when the respective guard 86 or 88 moves inwardly toward the circumferential surface of the elongated roller 38 in response to contact with an object having a thickness greater than 3/16 of an inch. At least one kill switch sensor 100 engages each guard 86 and 88 to signal when the guard 86 or 88 moves outwardly away from the circumferential surface of the elongated roller 38 in response to opening of the guard 86 or 88 to obtain internal access to the roller means 20.

Alternatively, the sensor 98 engaging each respective guard 86 and 88 could be replaced with an elongated length of pressure sensitive tape having opposing conducting surfaces defining an internal chamber for receiving a non-conductive fluid. The pressure sensitive tape could extend along the lower portion of the guard in an axial direction with respect to the central rotational axis of the roller means 20 providing a normally open circuit that can be closed when an object contacts the tape sufficiently to bring the opposing conductive surfaces of the tape into contact with one another. With pressure sensitive tape, the guards 86 and 88 could be designed to be non-pivoting if desired. The engagement preventing means 84 could include, as an alternative to the sensor 98 or pressure sensitive tape previously described, a proximity switch that would sense rotation or movement of the guard 86 and/or 88 inwardly toward the elongated roller 38.

Figure 8:
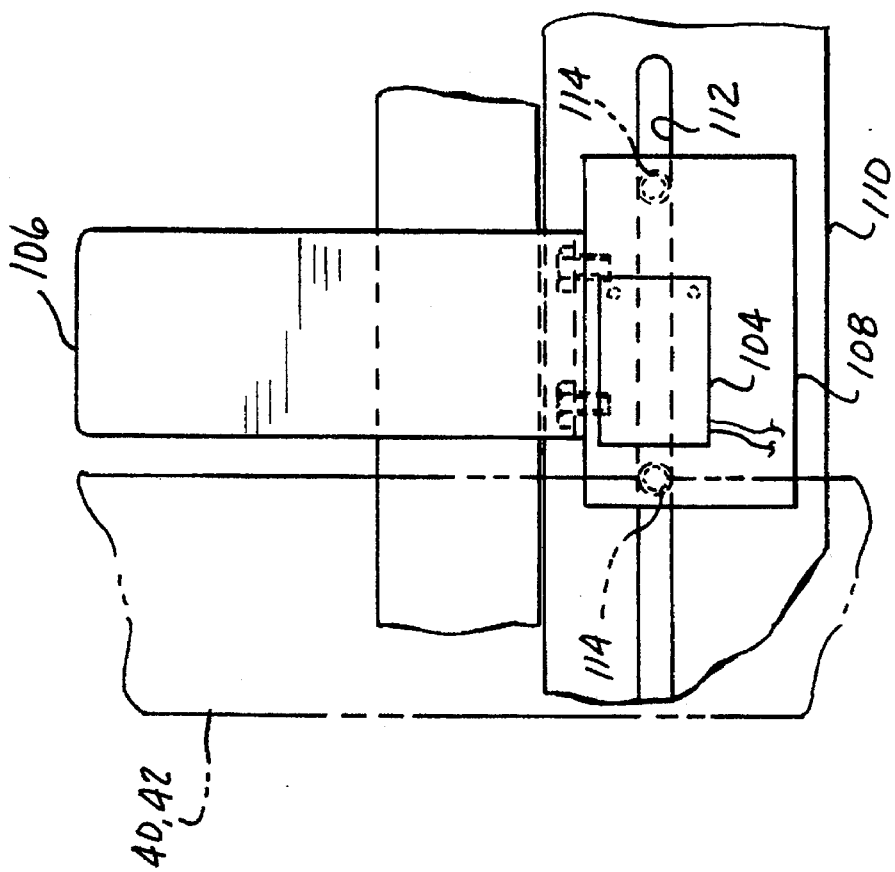
FIG. 8 is a detailed elevational view of the position sensor taken as shown in FIG. 7.
Figure 7:
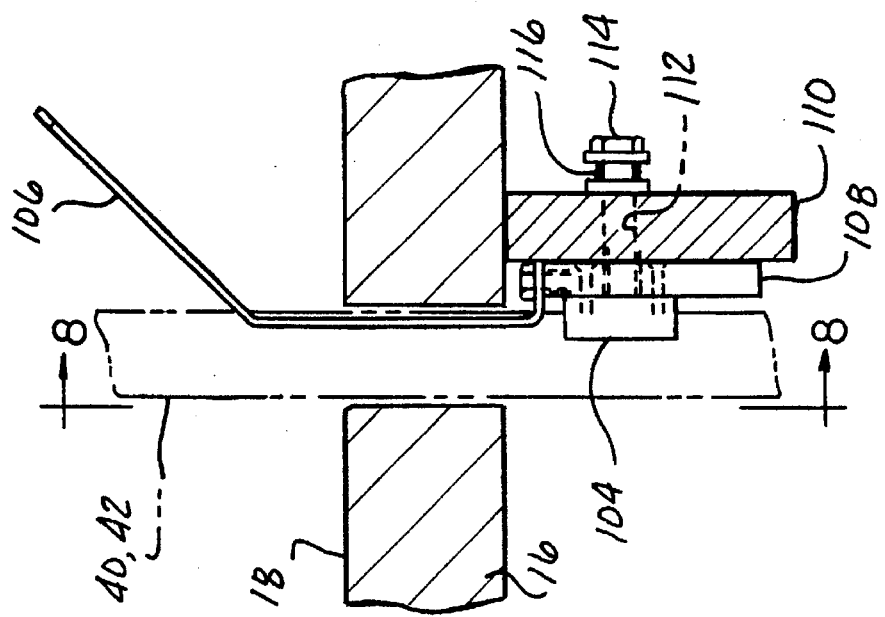
FIG. 7 is a cross-sectional detail view of a position sensor for adjusting the end limit of travel of the reciprocating press roller according to the present invention.

Referring now to FIGS. 7 and 8, means 102 is provided for adjusting a stroke length of the roller means 20. The stroke length adjusting means 102 can be defined by at least one switch or sensor 104 movable with respect to the table 16 to a plurality of positions to define at least one of the first and second end limits of travel of the roller means 20 to accommodate varying lengths of components 12 to be laminated. The sensor 104 may be a proximity sensor that senses movement of the vertically extending first and/or second support brackets 40 or 42 within a predefined distance of the sensor 104. As shown in FIGS. 1 and 2, two sensors can be provided having upwardly extending handles 106 to provide easy operator adjustment of the two end limits of travel of the roller means 20. As best seen in FIGS. 7 and 8, the handle 106 extends downwardly under the table 16 to connect to a sensor slide block 108 supporting a sensor 104 in position to sense the proximity of one of the support brackets 40 or 42 as it approaches the sensor 104. The sensor slide block 108 is connected to a slide bar 110 having at least one elongated slot 112 formed therein for slidably receiving a bolt or pin 114 to hold the slide block in position while allowing it to slide longitudinally along the slot 112 of the bar 110. A spring 116 may be positioned between the slide block 108 and the slide bar 110 to provide some resistance against free movement of the slide block 108 along the slide bar 110 unless urged in a particular direction by an operator's manipulation of one of the handles 106.

Figure 3:
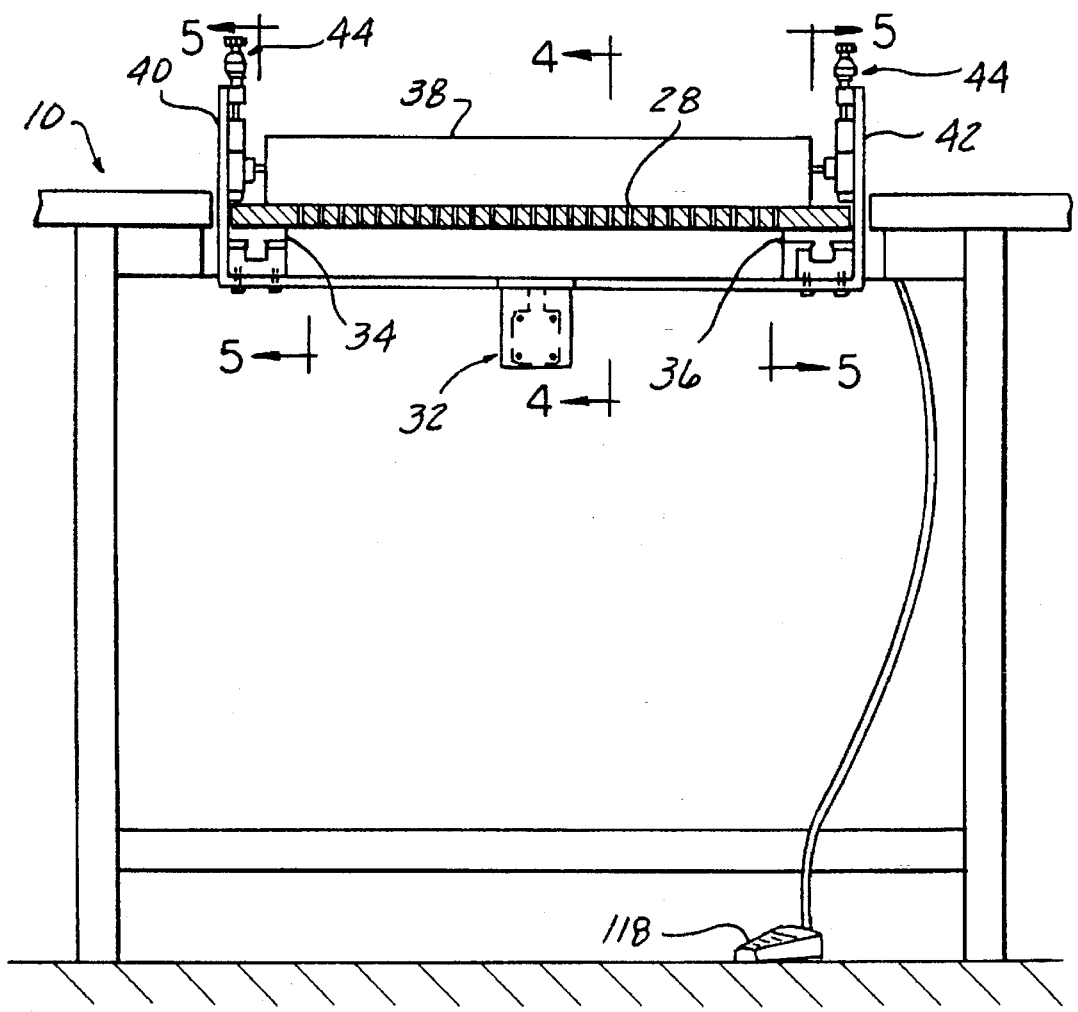
FIG. 3 is a front elevational view of the laminating apparatus according to the present invention.
Figure 4:
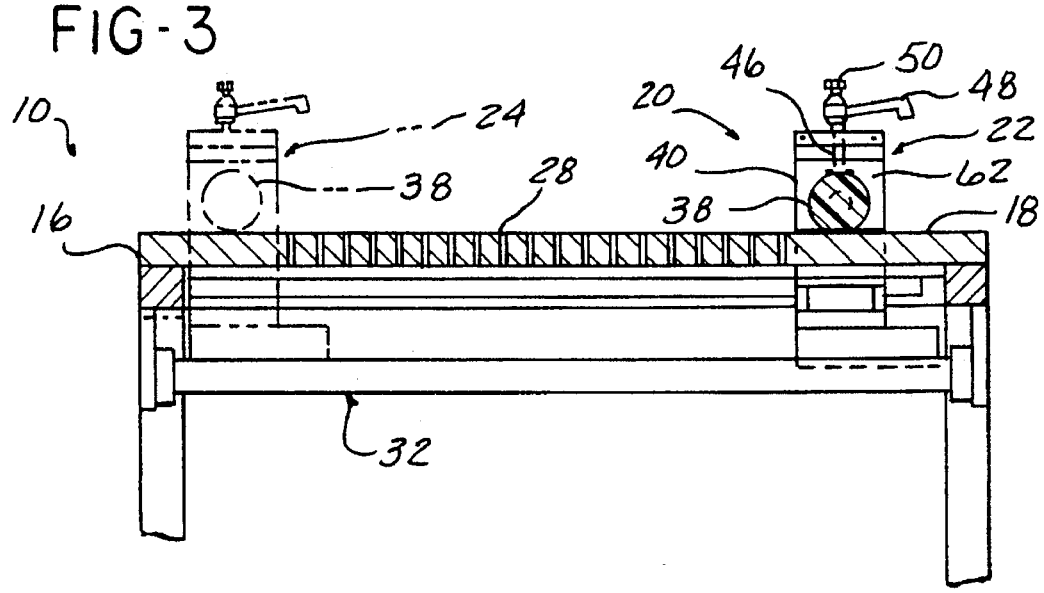
FIG. 4 is a partial side elevational view of the laminating apparatus according to the present invention.

In operation, an operator can depress the foot pedal 118, shown in FIGS. 1 and 3, to connect the source of vacuum to the apertures 28 extending through the first surface 18 to hold the lowermost component 12 with respect to the first surface 18 of the table 16. When an operator presses the foot pedal 118 a second time and holds the foot pedal down, the elongated roller 38 moves from its preselected home position until the foot pedal is released, or until the elongated roller 38 triggers the position sensor 104 indicating the end of travel in that direction. When the foot pedal 118 is again released, or when the support bracket 40 or 42 triggers the position sensor 104, the elongated roller 38 reverses direction and returns to the preselected home position. If an operator opens one of the guards 86 or 88 to gain internal access to the roller means 20, the corresponding kill switch sensor 100 is triggered to prevent actuation of the drive means 32, so that the elongated roller 38 cannot be moved in either direction. If during movement, the roller means 20 engages an object having a thickness greater than 3/16 of an inch, pressure against the corresponding guard 86 or 88 will trigger the sensor 98 causing the drive means 32 to immediately stop movement of the elongated roller 38 and to reverse direction for approximately 1 inch of travel before stopping. This prevents injury to the operator, or damage to the roller equipment by preventing the roller from engaging with an object greater than the thickness of the membranes to be laminated.

The present invention can also be used to apply die cut, or knife cut films to a substrate, or to apply masking to vinyl films. The apparatus of the present invention provides laminating assembly of membrane switches and touch panels. It allows the assembly of membrane switches faster, easier and with improved quality, while eliminating the fatigue commonly experienced by operators manually assembling membrane switches. The components are brought together in a gradual manner and with sufficient force to expel the air between the components just before the components adhere to one another to laminate the pressure sensitive materials without air entrapment, wrinkles or bubbles. This provides excellent lamination in sheet-to-sheet applications. The present invention preferably includes a computer controlled operating and guarding system that is a key to the machines simple and safe operation. The reciprocating laminating roller is guided by precision linear bearings and is completely covered by a pressure sensitive steel guard. If a foreign object greater than 3/16 of an inch thick is encountered by the roller mechanism during its travel, the roller will stop immediately and back up approximately 1 inch. The operator can selectively determine the home position for the roller mechanism either at the end limit of movement away from the operator, or at the end limit of movement close to the operator. In addition, the operator can adjust the end limits of travel of the roller in order to accommodate varying lengths of components to be laminated to one another. Further, the operator can adjust a speed of travel of the roller means 20 between the first and second end limits of travel independently in both directions of travel, so that if desired, the roller mechanism would return to the home position at a speed faster than the laminating speed. By selecting different home positions for the roller means 20, the operator can determine the direction of travel of the roller means 20 between the first and second end limits of travel during lamination of the components. If the home position is selected at the end limit of travel further away from the operator, the laminating stroke would take place toward the operator and the return stroke would take place away from the operator. If the home position of the roller means 20 is selected at the end limit of travel closest to the operator, the laminating stroke would be away from the operator and the return stroke would be toward the operator. The laminating pressure can be adjusted by the operator by using manual handles, or automated laminating pressure adjustments can be provided with programmable pressure settings set into the control means 70.

The present invention is suitable for graphic overlay lamination, membrane switch lamination, overlay to glass applications, overlay to metal backer lamination, membrane switch circuits, pressure sensitive adhesive applications, vinyl lettering applications, decal applications and wood grain lamination. The cycle speed of the present invention is adjustable between 2 and 8 seconds inclusive. As illustrated, the present invention requires 2.0 CFM (cubic feet per minute (ft$^3$/min.)) of compressed air at 80 PSI (pounds per square inch (lbs./in$^2$)) to operate the rodless air cylinder used as the drive means 32 in the illustrated embodiment, and 90 CFM (cubic feet per minute (ft$^3$/min.)) of vacuum is supplied at 90 inches of water (H$_2$O) to the plurality of apertures 28 through the first surface 18 of the table 16.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A method for laminating a plurality of sheet-like components to one another progressively one layer at a time into a built-up assembly, wherein at least one component is a flexible sheet-like layer with an adhesive on at least one side thereof, the method comprising the steps of:

loading a first component onto a vacuum table over alignment guide pins;

removing a liner covering an adhesive layer on the first component;

loading a second component onto the guide pins allowing only an area near the pins to come into contact with the first component;

activating movement of a press roller to adhesively join the first and second components together while being compressed between the press roller and the table as the second component is gradually and progressively brought into contact with the first component while the press roller advances with sufficient force to expel air between the two components before adhesion to one another; and preventing the press roller from engaging an object having more than a predetermined thickness during lamination with roller guard means surrounding a substantial portion of a periphery of the press roller.

2. A method for laminating a plurality of sheet-like components to one another progressively one layer at a time into a built-up assembly, wherein at least one component is a flexible sheet-like layer with an adhesive on at least one side thereof, the method comprising the steps of:

stacking a plurality of components in registered, aligned, superimposed relation to one another in a progressive incremental fashion one layer at a time on table means having a first surface to enable the components to be incrementally joined one layer at a time to one another as the components are progressively stacked and layered on top of one another and adhesively joined together;

laminating successively stacked components to one another, wherein the last two successively stacked components are progressively pressed together gradually between elongated roller means reciprocally mounted with respect to the table means for movement between first and second end limits of travel, said roller means progressively engagable with incrementally stacked components on the table means with sufficient force to expel air between the two components before adhesion to one another;

preventing the roller means from engaging an object having more than a predetermined thickness during lamination with roller guard means surrounding a substantial portion of a periphery of the roller means; and co-operatively engaging each of the successively stacked components with pin means connectible to the table means to align and superimpose successive components on top of one another for subsequent adhesive joining to one another in response to pressure from the roller means.

3. An apparatus for laminating a plurality of components to one another in an assembly, wherein at least one component is a flexible sheet-like layer with an adhesive on at least one side thereof, said apparatus comprising:

a table having a first surface for successively stacking a plurality of components in registered, aligned, superimposed relation to one another to enable the components to be incrementally joined to one another with one layer progressively stacked on top of another layer;

pin means connectible to the table for co-operatively engaging with each of the successively stacked components to align and superimpose successive components on top of one another;

roller means mounted on the table and progressively engageable with incrementally stacked components for laminating successively stacked components to one another, wherein the last two successively stacked components are progressively pressed together between the roller means and the table with sufficient force to expel air between the two components before adhesion to one another; and roller guard means covering a substantial peripheral portion of said roller means for preventing engagement of an object greater than 3/16 inches thick with the roller means during lamination.

4. The apparatus of claim 3 further comprising:

drive means for reciprocally moving the roller means between first and second end limits of travel across the successively stacked components.

5. The apparatus of claim 4 further comprising:

said drive means for reciprocally moving the roller means along a linear path, while allowing the roller means to rotate about an axis normal to the path.

6. The apparatus of claim 4 further comprising:

said drive means including a rodless pneumatic cylinder for reciprocally driving the roller means between the first and second end limits of travel.

7. The apparatus of claim 4 further comprising:

means for adjusting a stroke length of the roller means between the first and second end limits of travel.

8. The apparatus of claim 7 further comprising:

said stroke length adjusting means defined by at least one sensor moveable to a plurality of positions for at least one of the first and second end limits of travel to accommodate varying component lengths.

9. The apparatus of claim 4 further comprising:

means for adjusting a speed of travel of the roller means between the first and second end limits of travel independently in both directions of travel.

10. The apparatus of claim 4 further comprising:

means for selecting a direction of travel of the roller means between the first and second end limits of travel during lamination of the components.

11. The apparatus of claim 3 further comprising:

vacuum means for holding a lowermost component of the successively stacked components to the first surface of the table.

12. The apparatus of claim 3 further comprising:

means for adjusting pressure applied between the roller means and the table.

13. The apparatus of claim 12 further comprising:

the adjusting means including a threaded screw connecting the roller means to the table, such that rotating the screw in one direction increases the pressure between the roller means and the table, and rotating the screw in an opposite direction decreases the pressure between the roller means and the table.

14. The apparatus of claim 12 further comprising:

the adjusting means including a fluid actuated cylinder connecting the roller means to the table, wherein an increase in fluid pressure on one side of the cylinder increases the pressure between the roller means and the table.

15. The apparatus of claim 3 further comprising:

control means for controlling operation of the roller means, said control means including a program stored in memory allowing an operator to selectively set a home position for the roller means at one of the first and second end limits of movement, to selectively set a speed of travel of the roller means between the first and second end limits of travel in each direction independently of one another, and to actuate the roller means in response to an input signal from the operator.

16. An apparatus for laminating a plurality of components to one another in an assembly comprising:

a table having a first surface for successively stacking a plurality of components in registered, aligned, superimposed relation to one another to enable the components to be joined to one another;

roller means mounted on the table and engagable with stacked components for laminating successively stacked components to one another by bringing the last two successively stacked components together gradually with sufficient force to expel air between the two components just before adhesion to one another, said roller means having a cylindrical circumferential surface rotatable about a central axis; and means for preventing engagement of an object greater than 3/16 inches thick with the roller means, said engagement preventing means including a partial semi-cylindrical guard covering a substantial portion of the circumferential surface of the roller means, the guard pivotally connected to the roller means for rotation about a hinge axis offset from the central axis of the roller, the guard normally biased into a position spaced radially outwardly from the circumferential surface and at least one sensor engaging the guard to signal when the guard moves inwardly toward the circumferential surface of the roller means in response to contact with an object having a thickness greater than 3/16 of an inch.

17. The apparatus of claim 16 further comprising:

at least one kill switch sensor engaging the guard to signal when the guard moves outwardly away from the circumferential surface of the roller means in response to opening of the guard to obtain internal access to the roller means.

18. An apparatus for laminating a plurality of components to one another in an assembly comprising:

a table having a first surface for successively stacking a plurality of components in registered, aligned, superimposed relation to one another to enable the components to be joined to one another;

roller means mounted on the table and engagable with stacked components for laminating successively stacked components to one another by bringing the last two successively stacked components together gradually with sufficient force to expel air between the two components just before adhesion to one another, said roller means having a cylindrical circumferential surface rotatable about a central axis; and means for preventing engagement of an object greater than 3/16 inches thick with the roller means, said engagement preventing means including a partial semi-cylindrical guard connected to the roller means and covering a substantial portion of the circumferential surface of the roller means, an elongated length of pressure sensitive tape having opposing conductive surfaces defining an internal chamber for receiving a non-conductive fluid, the tape extending along the guard in an axial direction with respect to the central axis providing a normally open circuit that is closed when an object contacts the tape sufficiently to bring the opposing conductive surfaces of the tape into contact with one another.

19. An apparatus for laminating a plurality of components to one another in an assembly comprising:

a table having an upper surface for successively stacking a plurality of components in registered, aligned, superimposed relation to one another to enable the components to be joined to one another, the upper surface having a plurality of apertures formed therein;

a source of vacuum selectively connectible to the plurality of apertures formed in the upper surface of the table for holding at least one component in place when positioned thereon for lamination;

two spaced apart, parallel, linear guide rails connected to the table;

an elongated roller having opposite ends connected to the rails for sliding, guided movement along the rails as the roller rollingly engages the upper surface of the table;

drive means connected to the roller for reciprocating the roller along a path defined by the rails;

at least one sensor moveable with respect to the table for selectively positioning an end limit of travel of the roller along the path;

adjustable means connected to the roller for selectively varying pressure applied by the roller with respect to the table; and roller guard means surrounding a substantial portion of a circumference of the roller for preventing the roller from engaging an object having a thickness greater than 3/16 of an inch during lamination.

20. The apparatus of claim 19 further comprising:

means connectible to the table for aligning successively stacked components in registered, superimposed relation to one another during lamination.

21. In an apparatus for laminating a plurality of sheet-like components to one another progressively one layer at a time into a built-up assembly, wherein at least one component is a flexible sheet-like layer with an adhesive on at least one side thereof, the improvement comprising:

table means having a first surface for stacking a plurality of components in registered, aligned, superimposed relation to one another in a progressive incremental fashion one layer at a time to enable the components to be incrementally joined one layer at a time to one another as the components are progressively stacked and layered on top of one another and adhesively joined together;

elongated roller means reciprocally mounted with respect to the table means for movement between first and second end limits of travel, said roller means progressively engagable with incrementally stacked components for laminating successively stacked components to one another, wherein the last two successively stacked components are progressively pressed together gradually between the roller means and the table means with sufficient force to expel air between the two components before adhesion to one another;

roller guard means surrounding a substantial portion of a periphery of the roller means for preventing the roller means from engaging an object having more than a predetermined thickness during lamination; and pin means connectible to the table means for co-operatively engaging with each of the successively stacked components to align and superimpose successive components on top of one another for subsequent adhesive joining to one another in response to pressure from the roller means.

* * * * *